(12) United States Patent
Murata (10) Patent No.: US 10,531,020 B2
(45) Date of Patent: Jan. 7, 2020

(54) SOLID-STATE IMAGE PICKUP DEVICE, MANUFACTURING METHOD THEREFOR, AND ELECTRONIC APPARATUS

(71) Applicant: SONY SEMICONDUCTOR SOLUTIONS CORPORATION, Kanagawa (JP)

(72) Inventor: Kenichi Murata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/773,835

(22) PCT Filed: Nov. 4, 2016

(86) PCT No.: PCT/JP2016/082738
§ 371 (c)(1),
(2) Date: May 4, 2018

(87) PCT Pub. No.: WO2017/086180
PCT Pub. Date: May 26, 2017

(65) Prior Publication Data
US 2018/0324369 A1    Nov. 8, 2018

(30) Foreign Application Priority Data
Nov. 18, 2015 (JP) .................... 2015-225377

(51) Int. Cl.
*H04N 5/349* (2011.01)
*H04N 5/369* (2011.01)
*H01L 27/146* (2006.01)

(52) U.S. Cl.
CPC ....... *H04N 5/349* (2013.01); *H01L 27/14643* (2013.01); *H04N 5/369* (2013.01)

(58) Field of Classification Search
CPC ... H04N 5/349; H04N 5/369; H01L 27/14643
See application file for complete search history.

(56) References Cited

U.S. PATENT DOCUMENTS

2009/0115014 A1    5/2009  Kim
2011/0109776 A1 *  5/2011  Kawai ............... H01L 27/14625
                                                        348/273
(Continued)

FOREIGN PATENT DOCUMENTS

JP           08116045 A  *  5/1996
JP         H 08-116045        5/1996
(Continued)

OTHER PUBLICATIONS

International Search Report prepared by the Japan Patent Office dated Dec. 5, 2016, for International Application No. PCT/JP2016/082738.

*Primary Examiner* — Antoinette T Spinks
(74) *Attorney, Agent, or Firm* — Sheridan Ross P.C.

(57) ABSTRACT

The present disclosure relates to a solid-state image pickup device, a manufacturing method therefor, and an electronic apparatus that enables further miniaturization of a solid-state image pickup device to be achieved. A lower electrode is provided in each of pixels so as to hold a photoelectric conversion film including an organic material between the lower electrode and an upper electrode, and an isolation region is disposed to isolate the lower electrodes of the pixels from each other and includes at least a fixed charge film. The isolation region is formed by the fixed charge film that is formed more deeply than the thickness of the lower electrode. The present technology is, for example, applicable to a solid-state image pickup device having an organic photoelectric conversion film.

5 Claims, 7 Drawing Sheets

(56) References Cited

U.S. PATENT DOCUMENTS

| | | |
|---|---|---|
| 2011/0228150 A1 | 9/2011 | Takata |
| 2012/0033119 A1* | 2/2012 | Shinohara ......... H01L 27/14623 |
| | | 348/302 |
| 2012/0146173 A1 | 6/2012 | Ohta |
| 2015/0115336 A1 | 4/2015 | Sogoh |
| 2016/0035781 A1 | 2/2016 | Sogoh |
| 2016/0211288 A1* | 7/2016 | Yanagita ........... H01L 27/14643 |

FOREIGN PATENT DOCUMENTS

| | | |
|---|---|---|
| JP | 2011-198855 | 10/2011 |
| JP | 2011-216639 | 10/2011 |
| JP | 2011-249623 | 12/2011 |
| JP | 2012-124318 | 6/2012 |
| JP | 2013-175494 | 9/2013 |
| WO | WO 2011-148436 | 12/2011 |

* cited by examiner

SOLID-STATE IMAGE PICKUP DEVICE, MANUFACTURING METHOD THEREFOR, AND ELECTRONIC APPARATUS

CROSS REFERENCE TO RELATED APPLICATIONS

This application is a national stage application under 35 U.S.C. 371 and claims the benefit of PCT Application No. PCT/JP2016/082738 having an international filing date of 4 Nov. 2016, which designated the United States, which PCT application claimed the benefit of Japanese Patent Application No. 2015-225377 filed 18 Nov. 2015, the entire disclosures of each of which are incorporated herein by reference.

TECHNICAL FIELD

The present disclosure relates to a solid-state image pickup device, a manufacturing method therefor, and an electronic apparatus, and particularly to a solid-state image pickup device, a manufacturing method therefor, and an electronic apparatus that aim at enabling further miniaturization to be achieved.

BACKGROUND ART

Conventionally, in an electronic apparatus having an image pickup function of a digital still camera, a digital video camera, or the like, a solid-state image pickup device such as a CCD (Charge Coupled Device) or a CMOS (Complementary Metal Oxide Semiconductor) image sensor has been used. Further, in recent years, development of a solid-state image pickup device having a photoelectric conversion layer including organic materials has been advanced. For example, there is realized a configuration in which a photoelectric conversion layer is laminated on a light reception surface side of a semiconductor substrate on which photodiodes are formed and thereby light is received in a pixel by using the photodiode and the photoelectric conversion layer.

For example, PTL 1 discloses a solid-state image pickup apparatus in which in a solid-state image pickup device having a photoelectric conversion layer including organic materials, electrodes are provided under an insulating film (SiO2 film) and a potential barrier can be controlled by a voltage application through the electrodes.

CITATION LIST

Patent Literature

[PTL 1]
  WO 2013/001809A1

SUMMARY

Technical Problem

However, as disclosed in PTL 1 described above, a space in which electrodes are provided is needed in a configuration in which the electrodes are provided between pixels. Accordingly, a certain width is needed in a region in which pixels are isolated. Therefore, in recent years, it is difficult to achieve an increase in the number of pixels or downsizing required of a solid-state image pickup device.

The present disclosure has been made in view of the above circumstances and aims at enabling further miniaturization to be achieved.

Solution to Problem

A solid-state image pickup device according to one aspect of the present disclosure includes a lower electrode provided in each of pixels so as to hold a photoelectric conversion film including an organic material between the lower electrode and an upper electrode, and an isolation region disposed so as to isolate the lower electrodes of the pixels from each other and including at least a fixed charge film having a fixed charge.

A manufacturing method according to one aspect of the present disclosure includes the steps of forming a lower electrode provided in each of pixels so as to hold a photoelectric conversion film including an organic material between the lower electrode and an upper electrode, and forming an isolation region disposed so as to isolate the lower electrodes of the pixels from each other and including at least a fixed charge film having a fixed charge.

An electronic apparatus according to one aspect of the present disclosure includes a solid-state image pickup device including a lower electrode provided in each of pixels so as to hold a photoelectric conversion film including an organic material between the lower electrode and an upper electrode, and an isolation region disposed so as to isolate the lower electrodes of the pixels from each other and including at least a fixed charge film having a fixed charge.

In one aspect of the present disclosure, a lower electrode is provided in each of pixels so as to hold a photoelectric conversion film including an organic material between the lower electrode and an upper electrode, and an isolation region is disposed so as to isolate the lower electrodes of the pixels from each other and includes at least a fixed charge film having a fixed charge.

Advantageous Effect of Invention

In accordance with one aspect of the present disclosure, it is possible to achieve further miniaturization.

DESCRIPTION OF EMBODIMENTS

Hereinafter, specific embodiments to which the present technology is applied will be described in detail with reference to the accompanying drawings.

<First Embodiment of Solid-State Image Pickup Device>

Figure 1:
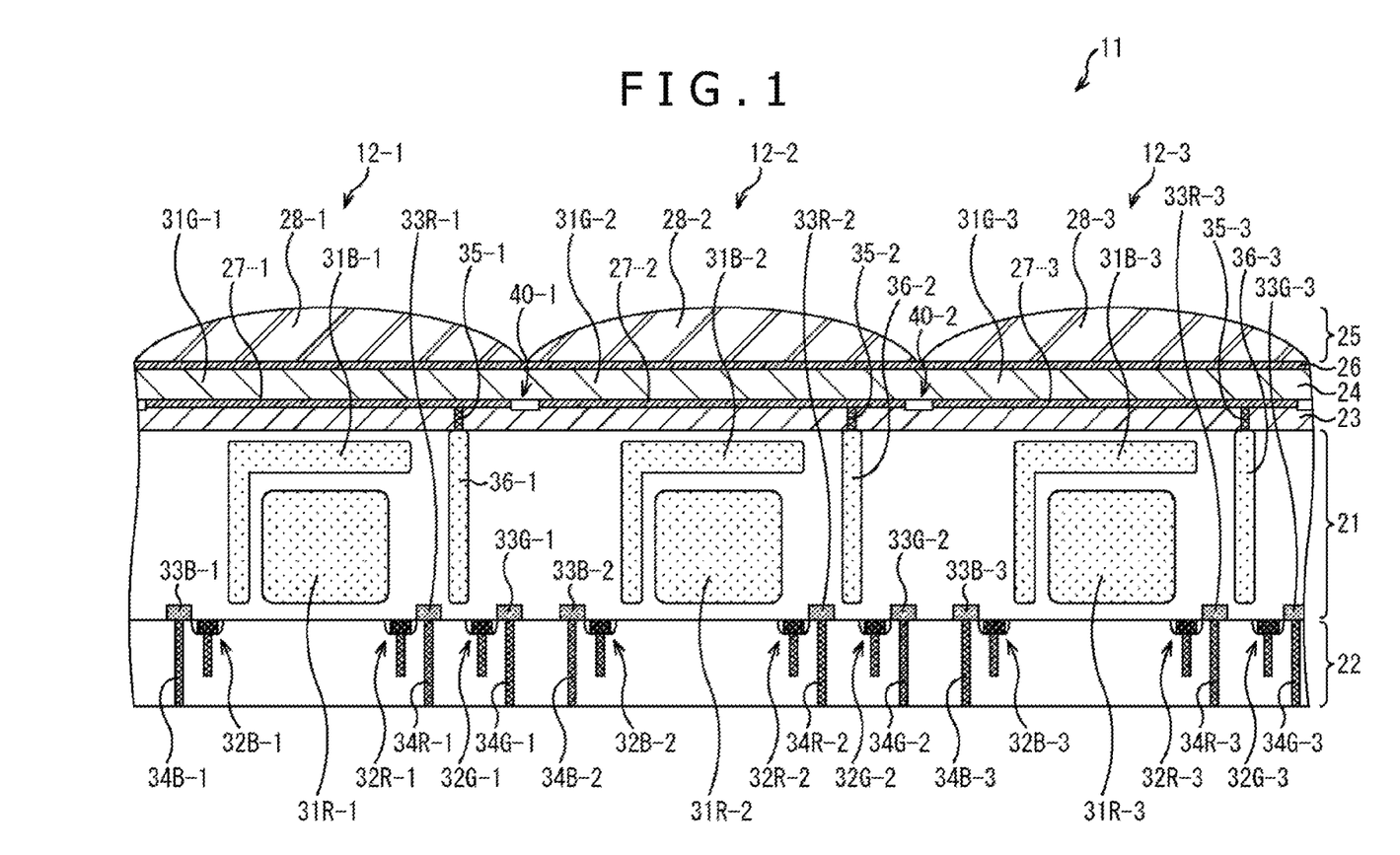
FIG. 1 is a diagram illustrating a cross-sectional configuration example of a first embodiment of a solid-state image pickup device to which the present technology is applied.

FIG. 1 is a diagram illustrating a cross-sectional configuration example of a first embodiment of a solid-state image pickup device to which the present technology is applied.

In FIG. 1, among a plurality of pixels 12 disposed on a sensor surface of a solid-state image pickup device 11, cross sections of portions on which three pixels 12-1 to 12-3 are disposed are illustrated.

As illustrated in FIG. 1, the solid-state image pickup device 11 has a configuration in which a semiconductor substrate 21, a wiring layer 22, an insulating film 23, an organic photoelectric conversion film 24, and an on-chip lens layer 25 are laminated. In addition, the solid-state image pickup device 11 has a configuration in which the organic photoelectric conversion film 24 is held between an upper electrode 26 thoroughly formed on the on-chip lens layer 25 side and lower electrodes 27-1 to 27-3 formed in the pixels 12-1 to 12-3, respectively, on the insulating film 23 side.

Further, in the solid-state image pickup device 1 the respective pixels 12-1 to 12-3 are formed in a similar manner. Hereinafter, arbitrarily, in a case in which the pixels 12-1 to 12-3 need not be discriminated, the pixels 12-1 to 12-3 are simply referred to as the pixels 12.

The semiconductor substrate 21 is, for example, a wafer thinly sliced from a single crystal silicon, and a photoelectric conversion section (photodiode) that includes a PN-junction is formed for each pixel 12 in the semiconductor substrate 21. In the semiconductor substrate 21, for example, in each pixel 12, a photoelectric conversion section 31R that photoelectrically converts red light is formed in a deep part from a light receiving surface side and a photoelectric conversion section 31B that photoelectrically converts blue light is formed in a shallow part from the light receiving surface side. In addition, in the semiconductor substrate 21, an impurity region 36 that is a transfer path of charges is formed in order to read charges generated in a photoelectric conversion section 31G that photoelectrically converts green light in the organic photoelectric conversion film 24 from a surface side of the semiconductor substrate 21.

Then, a transfer transistor 32R, a transfer transistor 32G, and a transfer transistor 32B that transfer charges are formed on a surface of the semiconductor substrate 21 in each pixel 12. In addition, an FD section 33R, an FD section 33G, and an FD section 33B that temporarily accumulate charges to be transferred and convert the charges to pixel signals corresponding to potentials are formed in the semiconductor substrate 21.

A wiring layer 22 is laminated on the surface side of the semiconductor substrate 21 and, for example, wiring for transmitting a pixel signal output from the pixels 12, wiring for transmitting a driving signal supplied to a transistor for driving the pixels 12, or the like is formed. In the wiring layer 22, for example, there are formed a through electrode 34R, a through electrode 34G, and a through electrode 34B that connect the FD section 33R, the FD section 33G, and the FD section 33B to gate electrodes of amplifier transistors (not illustrated).

The insulating film 23 is laminated on a rear surface side of the semiconductor substrate 21 and, for example, is a silicon oxide film (SiO2 film) having an insulating property. The insulating film 23 planarizes the rear surface side of the semiconductor substrate 21 and insulates between adjacent ones of the lower electrodes 27. Further, electrodes 35 are formed so as to pass through the insulating film 23, and the lower electrodes 27 and the impurity regions 36 are connected to each other via the electrodes 35.

The organic photoelectric conversion film 24 is a photoelectric conversion film including organic materials and, for example, photoelectrically converts green light. As illustrated in the figure, the organic photoelectric conversion film 24 is formed thoroughly and functions as the photoelectric conversion section 31G that outputs charges according to received light for each pixel 12 owing to a potential applied between the upper electrode 26 and the lower electrode 27 formed in the pixel 12.

The on-chip lens layer 25 includes a microlens 28 formed in each of the pixels 12 and collects irradiated light in each of the pixels 12.

In this manner, the solid-state image pickup device 11 has a configuration in which the photoelectric conversion section 31G, the photoelectric conversion section 31B, and the photoelectric conversion section 31R are disposed in a longitudinal direction in one pixel 12 to thereby photoelectrically convert green light, blue light, and red light by the pixel 12.

Further, the solid-state image pickup device 11 has a configuration in which an isolation region 40 is provided between the lower electrodes 27 in the insulating film 23. For example, an isolation region 40-1 is provided between the lower electrodes 27-1 and 27-2, and an isolation region 40-2 is provided between the lower electrodes 27-2 and 27-3.

Here, a configuration between the pixels 12 of the solid-state image pickup device 11 will be described with reference to FIG. 2.

Figure 2:
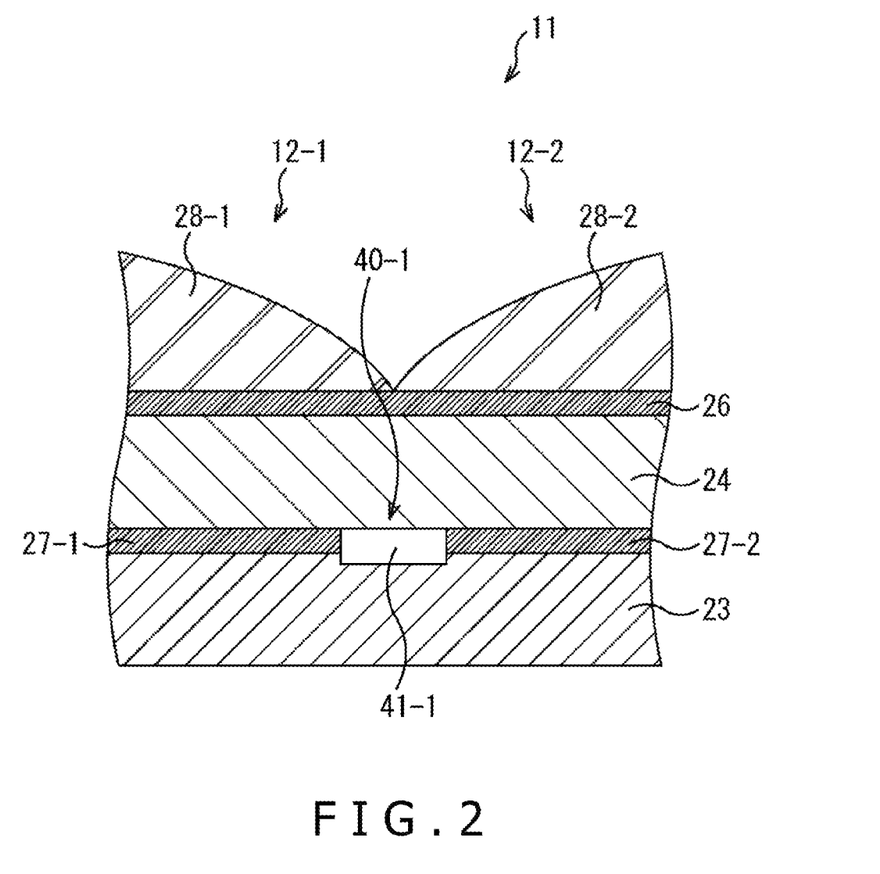
FIG. 2 is a diagram describing a configuration of a fixed charge film.

In FIG. 2, a cross-sectional configuration in the vicinity of the organic photoelectric conversion film 24 between the pixels 12-1 and 12-2 is enlarged and illustrated.

As illustrated in FIG. 2, the isolation region 40-1 is disposed between the pixels 12-1 and 12-2 so as to isolate the lower electrodes 27-1 and 27-2 from each other, and includes, for example, a fixed charge film 41-1 having a positive or negative fixed charge. The fixed charge film 41-1 is formed so as to be embedded within a recessed portion (refer to FIG. 3) that is formed more deeply than thicknesses of the lower electrodes 27-1 and 27-2.

In this manner, the solid-state image pickup device 11 performs potential control by the fixed charge film 41 provided in the isolation region 40 so as to isolate the lower electrodes 27 from each other. It is thus possible to improve an afterimage and suppress occurrence of leaks between the lower electrodes 27. In addition, in the solid-state image pickup device 11, as disclosed in PTL 1 described above, an electrode for performing potential control need not be provided between the lower electrodes 27. This permits miniaturization to be achieved.

For example, when a hole reading system is adopted in a device structure of the solid-state image pickup device 11, a positive fixed charge is given to the fixed charge film 41. Specifically, a silicon nitride film (SiN) or a silicon nitride oxide film (SiON) can be used as the fixed charge film 41.

Accordingly, in the solid-state image pickup device 11, a potential between the lower electrodes 27 is positively increased, and thereby a potential gradient becomes large between the lower electrodes 27 through the organic photoelectric conversion film 24 on the insulating film 23. As a result, in the solid-state image pickup device 11, a hole is easy to read, and thereby an improvement in an afterimage can be performed. Further, in the solid-state image pickup device 11, a potential barrier between the lower electrodes 27 becomes large, and thereby a hole is difficult to move between the lower electrodes 27. This permits occurrence of leaks to be suppressed.

Further, for example, when an electron reading system is adopted in the device structure of the solid-state image pickup device 11, a negative fixed charge is given to the fixed charge film 41. Specifically, a hafnium oxide film (HfO2), a zirconium dioxide film (ZrO2), an alumina film (AlO3), a titanium dioxide film (TiO2), a tantalum pentoxide film (Ta2O5), or the like can be used as the fixed charge film 41.

Accordingly, in the solid-state image pickup device 11, a potential between the lower electrodes 27 is negatively increased, and thereby a potential gradient becomes large between the lower electrodes 27 through the organic photoelectric conversion film 24 on the insulating film 23. As a result, in the solid-state image pickup device 11, an electron is easy to read, and thereby an improvement in an afterimage can be achieved. Further, in the solid-state image pickup device 11, a potential barrier becomes large between the lower electrodes 27, and thereby an electron is difficult to move between the lower electrodes 27. This permits occurrence of leaks to be suppressed.

As described above, in the solid-state image pickup device 11, the lower electrodes 27 are isolated from each other by using the isolation region 40 including the fixed charge film 41, and thereby miniaturization can be achieved while occurrence of an afterimage and leaks is suppressed. That is, when the size of the solid-state image pickup device 11 is to be kept the same, an increase in the number of pixels can be achieved and when the number of pixels of the solid-state image pickup device 11 is to be kept the same, downsizing can be achieved.

Figure 3:
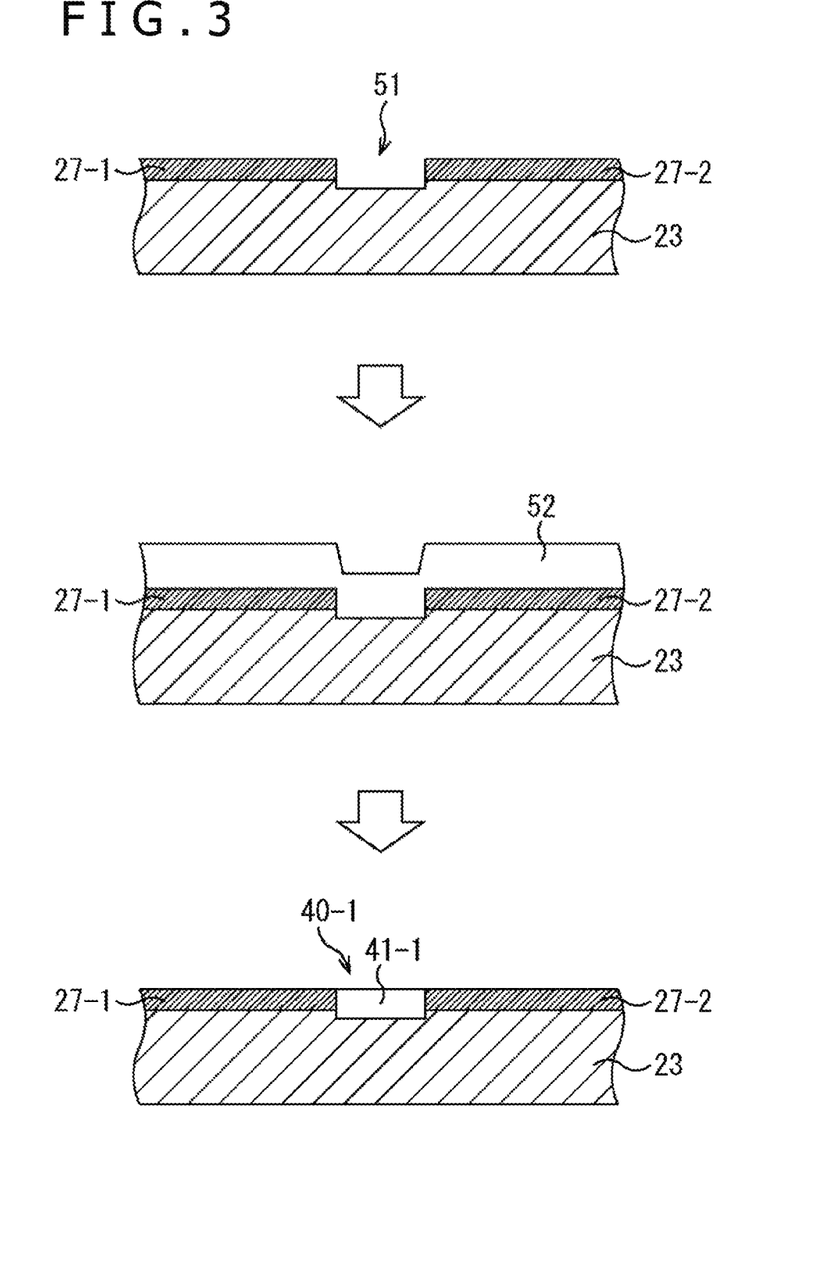
FIG. 3 is a diagram describing a method for manufacturing the solid-state image pickup device.

Next, the processes in which the isolation region 40 is provided in a method for manufacturing the solid-state image pickup device 11 will be described with reference to FIG. 3.

First, in a first process, the insulating film 23 is formed on the semiconductor substrate 21 of FIG. 1 and a film of electrode material to be formed as the lower electrodes 27 is formed thoroughly. Then, an etching for isolating the electrode material for each pixel 12 and forming the lower electrodes 27 is performed. At this time, the etching is performed more deeply than the thicknesses of the lower electrodes 27-1 and 27-2 to thereby form a recessed portion 51.

Next, in a second process, a fixed charge film 52 is formed thoroughly on the insulating film 23 and the lower electrodes 27 and is embedded even within the recessed portion 51. For example, when the hole reading system is adopted in the solid-state image pickup device 11, a film of silicon nitride (SiN) or silicon nitride oxide (SiON) is formed, for example, by using an ALD (Atomic Layer Deposition) method, a CVD (Chemical Vapor Deposition) method, or the like to thereby form the fixed charge film 52.

Then, in a third process, for example, a CMP (Chemical Mechanical Polishing) is performed and the fixed charge film 52 formed on an upper surface of the lower electrodes 27 is removed. Through this process, the fixed charge film 41-1 is formed by a portion of the fixed charge film 52 embedded within the recessed portion 51 and the isolation region 40 is provided between the lower electrodes 27-1 and 27-2. Then, the organic photoelectric conversion film 24, the upper electrode 26, and the on-chip lens layer 25 are formed and the solid-state image pickup device 11 is manufactured as illustrated in FIG. 1.

The fixed charge film 41 is formed through the above-described processes, and thus the solid-state image pickup device 11 in which the isolation region 40 is provided so as to isolate the lower electrodes 27 from each other can be manufactured.

<Second Embodiment of Solid-State Image Pickup Device>

Figure 4:
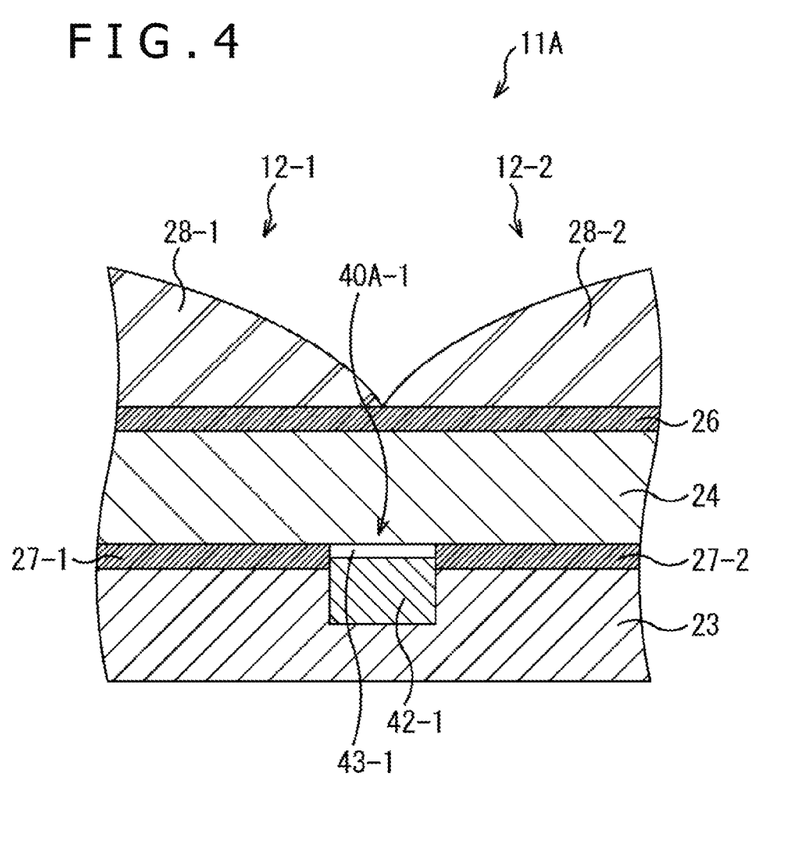
FIG. 4 is a diagram describing a configuration of a fixed charge film according to a second embodiment of a solid-state image pickup device.

Next, FIG. 4 is a diagram illustrating a cross-sectional configuration example of a second embodiment of a solid-state image pickup device to which the present technology is applied. It is to be noted that, in FIG. 4, similarly to FIG. 2, a cross-sectional configuration in the vicinity of the organic photoelectric conversion film 24 between the pixels 12-1 and 12-2 is enlarged and illustrated. A same sign is given to a configuration in common with that of the solid-state image pickup device 11 of FIG. 2 and detailed descriptions are omitted.

That is, as illustrated in FIG. 4, a solid-state image pickup device 11A has a configuration in which the lower electrode 27 is provided in each of the pixels 12 and the organic photoelectric conversion film 24 is held between the lower electrodes 27 and the upper electrode 26. The above-described point is common to the solid-state image pickup device 11A and the solid-state image pickup device 11 of FIG. 2.

On the other hand, the solid-state image pickup device 11A has a configuration in which an isolation region 40A having a laminated structure of an insulating film 42 and a fixed charge film 43 is provided between the lower electrodes 27. In the above-described point, the solid-state image pickup device 11A differs from the solid-state image pickup device 11 of FIG. 2.

That is, an isolation region 40A-1 that is provided between the pixels 12-1 and 12-2 is disposed so as to isolate the lower electrodes 27-1 and 27-2 from each other, a fixed charge film 43-1 is formed so as to be in contact with the organic photoelectric conversion film 24, and an insulating film 42-1 is formed on a lower layer side of the fixed charge film 43-1. The fixed charge film 43-1 is formed more shallowly than the thicknesses of the lower electrodes 27-1 and 27-2, and the insulating film 42-1 is formed more deeply than the thicknesses of the lower electrodes 27-1 and 27-2.

Even in the solid-state image pickup device 11A having the above-described configuration, similarly to the solid-state image pickup device 11 of FIG. 2, an improvement in an afterimage can be achieved, occurrence of leaks can be suppressed, and miniaturization can be achieved. In addition, the solid-state image pickup device 11A has a structure in which the fixed charge film 43 is formed thin, and thereby more fixed charges are easy to be generated in an interface between the fixed charge film 43 and the organic photoelectric conversion film 24 as compared with the solid-state image pickup device 11 of FIG. 2. This structure permits a potential barrier between the lower electrodes 27 to be more heightened.

Figure 5:
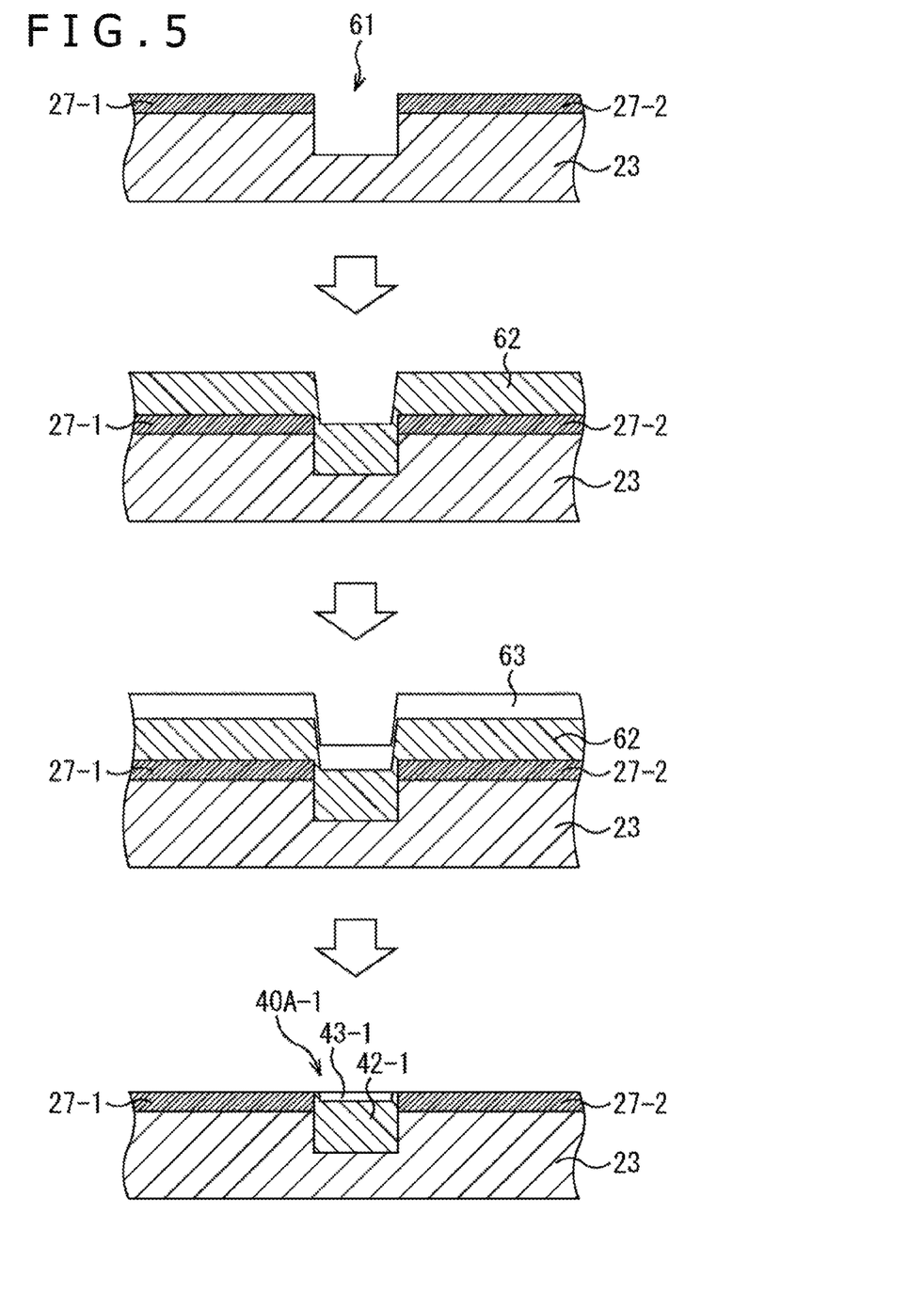
FIG. 5 is a diagram describing a method for manufacturing the solid-state image pickup device.

Next, the processes in which the isolation region 40A is provided in a method for manufacturing the solid-state image pickup device 11A will be described with reference to FIG. 5.

First, in an eleventh process, the insulating film 23 is formed on the semiconductor substrate 21 of FIG. 1 and a film of electrode material to be formed as the lower electrodes 27 is formed thoroughly. Then, an etching for isolating the electrode material for each pixel 12 and forming the lower electrodes 27 is performed. At this time, the etching is performed more deeply than the thicknesses of the lower electrodes 27-1 and 27-2 to thereby form a recessed portion 61.

Next, in a twelfth process, oxide silicon (SiO2) is laminated thoroughly on the insulating film 23 and the lower electrodes 27 to thereby form an insulating film 62, and the insulating film 62 is embedded even within the recessed portion 61. At this time, the thickness of the insulating film 62 is set to less than the depth of the recessed portion 61, and the insulating film 62 is formed so that the recessed portion 61 still has a recess at least allowing the fixed charge film 43 to be laminated.

Further, in a third process, a fixed charge film 63 is formed thoroughly on the insulating film 62 and the fixed charge film 63 is embedded even within a recess of the insulating film 62 corresponding to the recessed portion 61.

Then, in a fourteenth process, the insulating film 62 and the fixed charge film 63 formed on an upper surface of the lower electrodes 27 are removed. Through this process, the insulating film 42-1 and the fixed charge film 43-1 are formed by portions of the insulating film 62 and the fixed charge film 63 embedded within the recessed portion 61, and the isolation region 40A-1 is provided between the lower electrodes 27-1 and 27-2. Then, the organic photoelectric conversion film 24, the upper electrode 26, and the on-chip lens layer 25 are formed.

The insulating film 42 and the fixed charge film 43 are formed through the above-described processes, and thus the solid-state image pickup device 11A in which the isolation region 40A is provided so as to isolate the lower electrodes 27 from each other can be manufactured.

<Configuration Example of Electronic Apparatus>

It is to be noted that, the solid-state image pickup device 11 according to each embodiment as described above can be applied to various electronic apparatuses such as an image pickup system such as a digital still camera or a digital video camera, a mobile phone having an image pickup function, or other apparatuses having an image pickup function.

Figure 6:
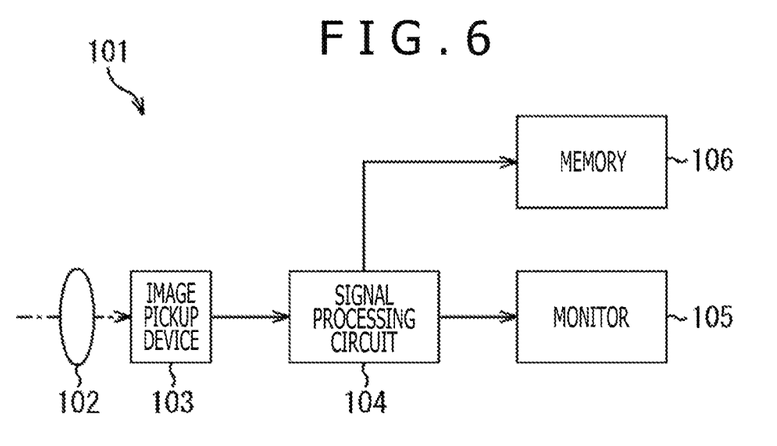
FIG. 6 is a block diagram illustrating a configuration example of an image pickup apparatus mounted on electronic apparatuses.

FIG. 6 is a block diagram illustrating a configuration example of an image pickup apparatus mounted on electronic apparatuses.

As illustrated in FIG. 6, an image pickup apparatus 101 includes an optical system 102, an image pickup device 103, a signal processing circuit 104, a monitor 105, and a memory 106 and can pick up a still image and a moving image.

The optical system 102 includes one or a plurality of lenses, guides image light (incident light) from a subject to the image pickup device 103, and forms an image on a light receiving surface (sensor section) of the image pickup device 103.

As the image pickup device 103, the solid-state image pickup device 11 according to each embodiment described above is used. In the image pickup device 103, electrons are accumulated for a certain period in accordance with an image formed on the light receiving surface via the optical system 102. Then, signals according to the electrons accumulated in the image pickup device 103 are supplied to the signal processing circuit 104.

The signal processing circuit 104 performs various kinds of signal processing on a pixel signal output from the image pickup device 103. An image (image data) obtained by performing the signal processing by the signal processing circuit 104 is supplied to and displayed on the monitor 105 or is supplied to and stored (recorded) in the memory 106.

In the image pickup apparatus 101 configured in this manner, the solid-state image pickup device 11 according to each embodiment described above is used and thereby, for example, an increase in the number of pixels or downsizing can be achieved.

<Usage Example of Image Sensor>

Figure 7:
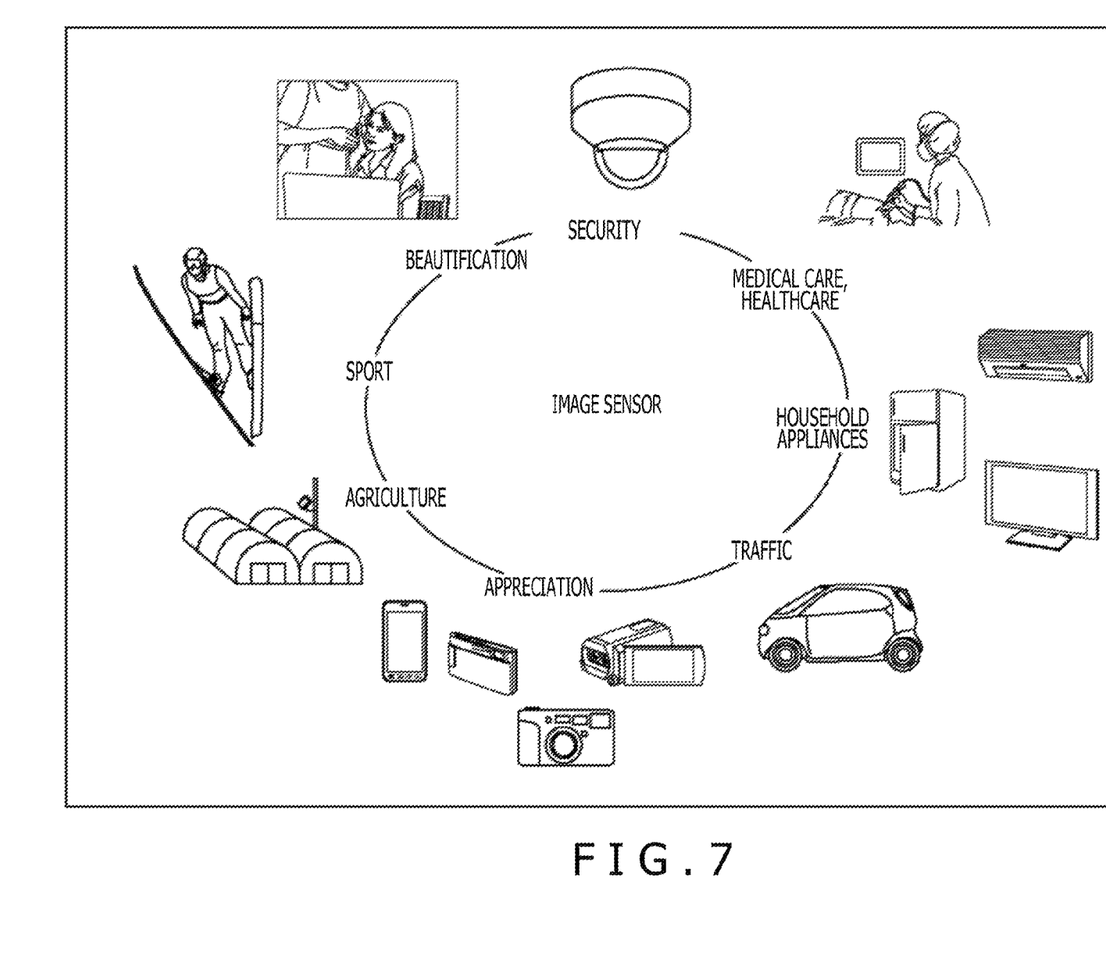
FIG. 7 is a diagram illustrating usage examples for using an image sensor.

FIG. 7 is a diagram illustrating usage examples for using the above-described image sensor (solid-state image pickup device 11).

The above-described image sensor can be used, for example, in various cases in which light such as visible light, infrared light, ultraviolet light, or an X-ray is sensed, as described below.

- An apparatus for photographing an image for use in appreciation such as a digital camera or a mobile device having a camera function
- An apparatus for use in traffic such as an on-vehicle sensor that photographs a front, a rear, a circumference, the inside, etc. of a vehicle, a monitoring camera that monitors moving vehicles or roads, or a ranging sensor that measures a distance between vehicles for the purpose of safety drive like automatic stop, recognition of a state of drivers, or the like
- An apparatus for use in household appliances such as TV sets, refrigerators, or air conditioners in order to photograph gestures of a user and perform an equipment operation in accordance with the gestures
- An apparatus for use in medical care or healthcare such as an endoscope or an apparatus for performing an angiography by receiving infrared light
- An apparatus for use in security such as monitoring cameras for crime prevention or cameras for person authentication
- An apparatus for use in beautification, such as a skin measuring unit for photographing a skin or a microscope for photographing a scalp
- An apparatus for use in sport such as action cameras or wearable cameras for sport usage, etc.
- An apparatus for use in agriculture, such as cameras for monitoring a state of fields or crops Note that the present technology also can adopt the following configurations.

(1)
A solid-state image pickup device including:
a lower electrode provided in each of pixels so as to hold a photoelectric conversion film including an organic material between the lower electrode and an upper electrode; and
an isolation region disposed so as to isolate the lower electrodes of the pixels from each other and including at least a fixed charge film having a fixed charge.

(2)
The solid-state image pickup device according to (1) above, in which
the isolation region is formed by the fixed charge film that is formed more deeply than a thickness of the lower electrode.

(3)
The solid-state image pickup device according to (1) above, in which
the isolation region is formed by a laminated structure including the fixed charge film that is formed more shallowly than the thickness of the lower electrode so as to be in contact with the photoelectric conversion film and an insulating film that is formed more deeply than the thickness of the lower electrode on a lower layer side of the fixed charge film.

(4)
The solid-state image pickup device according to any one of (1) to (3) above, in which
in the solid-state image pickup device, a hole reading system is adopted, and
the fixed charge film has a positive fixed charge.

(5)

The solid-state image pickup device according to any one of (1) to (3) above, in which
   in the solid-state image pickup device, an electron reading system is adopted, and
   the fixed charge film has a negative fixed charge.

(6)

A method for manufacturing a solid-state image pickup device, including the steps of:
   forming a lower electrode provided in each of pixels so as to hold a photoelectric conversion film including an organic material between the lower electrode and an upper electrode; and
   forming an isolation region disposed so as to isolate the lower electrodes of the pixels from each other and including at least a fixed charge film having a fixed charge.

(7)

An electronic apparatus including:
   a solid-state image pickup device including
      a lower electrode provided in each of pixels so as to hold a photoelectric conversion film including an organic material between the lower electrode and an upper electrode, and
      an isolation region disposed so as to isolate the lower electrodes of the pixels from each other and including at least a fixed charge film having a fixed charge.

Note that the present embodiment is not limited to the embodiments described above and various modifications can be made without departing from the spirit and scope of the present disclosure.

REFERENCE SIGNS LIST

11 Solid-state image pickup device, 12 Pixel, 21 Semiconductor substrate, 22 Wiring layer, 23 Insulating film, 24 Organic photoelectric conversion film, 25 On-chip lens layer, 26 Upper electrode, 27 Lower electrode, 28 Microlens, 40 Isolation region, 41 Fixed charge film, 42 Insulating film, 43 Fixed charge film

The invention claimed is:

1. A solid-state image pickup device comprising:
   a plurality of pixels;
   a plurality of lower electrodes, wherein one lower electrode is provided in each of the pixels;
   a photoelectric conversion film including an organic material between and in contact with the lower electrode and an upper electrode; and
   a plurality of isolation regions,
   wherein each isolation region is disposed so as to isolate an adjacent pair of the lower electrodes of the pixels from each other,
   wherein each of the isolation regions is in contact with a respective pair of adjacent lower electrodes,
   wherein each of the isolation regions includes at least a fixed charge film having a fixed charge,
   wherein the isolation region is formed by a laminated structure including the fixed charge film that is formed more shallowly than the thickness of the lower electrode so as to be in contact with the photoelectric conversion film, and
   wherein an insulating film is formed more deeply than the thickness of the lower electrode on a lower layer side of the fixed charge film.

2. The solid-state image pickup device according to claim 1, wherein
   in the solid-state image pickup device, a hole reading system is adopted, and
   the fixed charge film has a positive fixed charge.

3. The solid-state image pickup device according to claim 1, wherein
   in the solid-state image pickup device, an electron reading system is adopted, and
   the fixed charge film has a negative fixed charge.

4. A method for manufacturing a solid-state image pickup device, comprising the steps of:
   forming a plurality of lower electrodes,
   wherein one lower electrode is provided in each of a plurality of pixels so as to hold a photoelectric conversion film including an organic material between each of the lower electrodes and an upper electrode, and
   wherein the lower electrodes are in contact with the photoelectric conversion film;
   forming a plurality of isolation regions,
   wherein an isolation region is disposed so as to isolate an adjacent pair of the lower electrodes of the pixels from each other,
   wherein each of the isolation regions is in contact with a respective pair of adjacent lower electrodes, and
   wherein each of the isolation regions includes at least a fixed charge film having a fixed charge;
      forming the isolation region by a laminated structure including the fixed charge film that is formed more shallowly than the thickness of the lower electrode so as to be in contact with the photoelectric conversion film; and
      forming an insulating film more deeply than the thickness of the lower electrode on a lower layer side of the fixed charge film.

5. An electronic apparatus comprising:
   a solid-state image pickup device including:
      a plurality of pixels;
      a plurality of lower electrodes, wherein one lower electrode is provided in each of the pixels;
      a photoelectric conversion film including an organic material between and in contact with the lower electrode and an upper electrode, and
      a plurality of isolation regions,
      wherein each isolation region is disposed so as to isolate an adjacent pair of the lower electrodes of the pixels from each other,
      wherein each of the isolation regions is in contact with a respective pair of adjacent lower electrodes,
      wherein each of the isolation regions includes at least a fixed charge film having a fixed charge,
      wherein the isolation region is formed by a laminated structure including the fixed charge film that is formed more shallowly than the thickness of the lower electrode so as to be in contact with the photoelectric conversion film and
      wherein an insulating film is formed more deeply than the thickness of the lower electrode on a lower layer side of the fixed charge film.

* * * * *